(12) United States Patent
Yang et al.

(10) Patent No.: US 7,916,928 B2
(45) Date of Patent: Mar. 29, 2011

(54) REAL-TIME DISPENSER FAULT DETECTION AND CLASSIFICAITION METHOD

(75) Inventors: Tsu-Kuang Yang, Hsinchu (TW); Ho-Shin Li, Hsinchu (TW); Ching-Shun Chen, Hsinchu (TW); Hsien-Po Hsiesh, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 1012 days.

(21) Appl. No.: 11/785,506

(22) Filed: Apr. 18, 2007

(65) Prior Publication Data

US 2008/0159617 A1 Jul. 3, 2008

(30) Foreign Application Priority Data

Dec. 29, 2006 (TW) .............................. 95149750 A

(51) Int. Cl.
G06K 9/00 (2006.01)
G06K 9/62 (2006.01)
G06K 9/32 (2006.01)
(52) U.S. Cl. ......... 382/141; 382/145; 382/228; 382/286
(58) Field of Classification Search .................. 382/141, 382/145, 228, 286
See application file for complete search history.

(56) References Cited

U.S. PATENT DOCUMENTS

| | | | | |
|---|---|---|---|---|
| 4,724,302 A | * | 2/1988 | Penney et al. | 219/130.21 |
| 5,026,989 A | * | 6/1991 | Merkel | 250/338.1 |
| 5,666,325 A | * | 9/1997 | Belser et al. | 367/95 |
| 5,711,989 A | * | 1/1998 | Ciardella et al. | 427/8 |
| 5,837,892 A | * | 11/1998 | Cavallaro et al. | 73/149 |
| 5,918,648 A | * | 7/1999 | Carr et al. | 141/198 |
| 6,023,666 A | * | 2/2000 | Jiang et al. | 702/173 |
| 6,991,825 B2 | * | 1/2006 | Hui et al. | 427/98.4 |
| 7,249,287 B2 | * | 7/2007 | Littrell | 714/47 |
| 7,292,278 B2 | * | 11/2007 | Misawa | 348/342 |
| 7,462,377 B2 | * | 12/2008 | Gaon et al. | 427/427.2 |
| 2005/0235913 A1 | * | 10/2005 | Prentice et al. | 118/712 |
| 2006/0254511 A1 | * | 11/2006 | Puffe | 118/713 |
| 2009/0107612 A1 | * | 4/2009 | Gruber | 156/64 |

FOREIGN PATENT DOCUMENTS

| | | |
|---|---|---|
| JP | 6-266447 | 9/1994 |
| JP | 2004-165035 | 6/2004 |
| JP | 2005-21755 | 1/2005 |
| JP | 2005-118672 | 5/2005 |
| JP | 2006-136836 | 6/2006 |
| TW | I257538 | 7/2006 |

OTHER PUBLICATIONS

Burges "A Tutorial on Support Vector Machines for Pattern Recognition" Data Mining and Knowledge Discovery 2, 1998, pp. 121-167.*

* cited by examiner

*Primary Examiner* — Bhavesh M Mehta
*Assistant Examiner* — Utpal Shah
(74) *Attorney, Agent, or Firm* — Rabin & Berdo, P.C.

(57) ABSTRACT

A real-time dispenser fault detection and classification method for monitoring adhesive dots dispensed on a substrate by a dispenser includes dispensing adhesive on the substrate by the dispenser so as to form a plurality of adhesive dots on the substrate, capturing images formed on the substrate by the adhesive dots as soon as the adhesive dots are formed on the substrate, and comparing topology data of the images with predetermined topology data based on a predetermined comparison rule so as to create data about the operation condition of the dispenser.

20 Claims, 2 Drawing Sheets

REAL-TIME DISPENSER FAULT DETECTION AND CLASSIFICAITION METHOD

BACKGROUND OF THE INVENTION

1. Field of the Invention

The present invention relates to dispensers, and more particularly, to a real-time dispenser fault detection and classification method for monitoring adhesive dots dispensed on a substrate by a dispenser.

2. Description of the Prior Art

A dispenser dispenses adhesive contained therein on a circuit board through a nozzle of the dispenser so as to form on the circuit board a plurality of adhesive dots for adhesively holding an electronic device. After a long period of operation, the nozzle of the dispenser is likely to be clogged with residues of the adhesive. Besides, the nozzle has to be so close to the circuit board while spraying the adhesive on the circuit board that the nozzle can touch the circuit board inadvertently and undesirably. As a result, the dispenser is susceptible to a nozzle jam characterized by distorted or disrupted adhesive jets, or displacement of the dispenser nozzle results in displaced adhesive jets.

In order to classify the aforesaid abnormalities of a dispenser, the prior art discloses judging the adhesive dot quality with the naked eye and determining whether the dispenser nozzle has to be changed or cleaned. Considering the need for automation and speedy production, the eye-based prior art is both unrealistic and cost-inefficient. More badly, an equipment engineer is unable to perform quality inspection on adhesive dots dispensed on a circuit board unless and until the dispensing of the adhesive dots is complete. In other words, whatever abnormalities a dispenser might have exhibited are not discovered by the equipment engineer unless and until the dispenser finishes dispensing the adhesive dots on the circuit board.

SUMMARY OF THE INVENTION

In light of the aforesaid drawbacks of the prior art, it is a primary objective of the present invention to disclose a real-time dispenser fault detection and classification method for classifying abnormalities of a dispenser in a real-time manner by monitoring adhesive jets of different axes, lengths, and widths dispensed by the dispenser.

In order to achieve the above and other objectives, the present invention discloses a real-time dispenser fault detection and classification method for monitoring adhesive dots dispensed on a substrate by a dispenser, the method comprising the steps of: dispensing, by the dispenser, adhesive on the substrate so as to form a plurality of adhesive dots on the substrate; capturing images formed on the substrate by the adhesive dots as soon as the adhesive dots are formed on the substrate ; and comparing topology data of the images with predetermined topology data in accordance with a predetermined comparison rule so as to create data about the operation condition of the dispenser.

In the preferred embodiment of the present invention, the predetermined comparison rule is an inference engine comprising a plurality of predetermined conclusions. The predetermined conclusions respectively indicate three operation conditions comprising: an operation condition featuring a well-functioning nozzle of the dispenser (hereinafter referred to as "well-functioning"); an operation condition featuring a displaced nozzle of the dispenser (hereinafter referred to as "displaced"); and an operation condition featuring a jammed nozzle of the dispenser (hereinafter referred to as "jammed").

The topology data comprises an average of widths of the adhesive dots, an variance of the widths of the adhesive dots, an average of absolute width differences (|target width minus actual width|) of the adhesive dots, and an variance of the absolute width differences. The dispenser dispenses adhesive on a substrate along a first actuation axis and a second actuation axis perpendicular to the first actuation axis, so as to form on the substrate a plurality of first adhesive dots along the first actuation axis and a plurality of second adhesive dots along the second actuation axis. The dispenser dispenses the adhesive on the substrate along the first actuation axis, a single image capturing unit faces a first direction extending from the first actuation axis and thereby is able to capture the first images of the first adhesive dots. Similarly, where the dispenser dispenses the adhesive on the substrate along the second actuation axis, the single image capturing unit faces a second direction extending from the second actuation axis and thereby is able to capture the second images of the second adhesive dots.

The preferred embodiment of the present invention discloses a first actuation axis perpendicular to a second actuation axis. However, another preferred embodiment of the present invention discloses a first actuation axis not perpendicular to a second actuation axis, and an additional actuation axis other than the first and second actuation axes. In other words, the method disclosed in the present invention is applicable to multiple axes and adhesive jets of different lengths and widths.

DETAILED DESCRIPTION OF THE PREFERRED EMBODIMENT

The following specific embodiment is provided to illustrate the present invention. Persons skilled in the art can readily gain an insight into other advantages and features of the present invention based on the contents disclosed in this specification.

Figure 1:
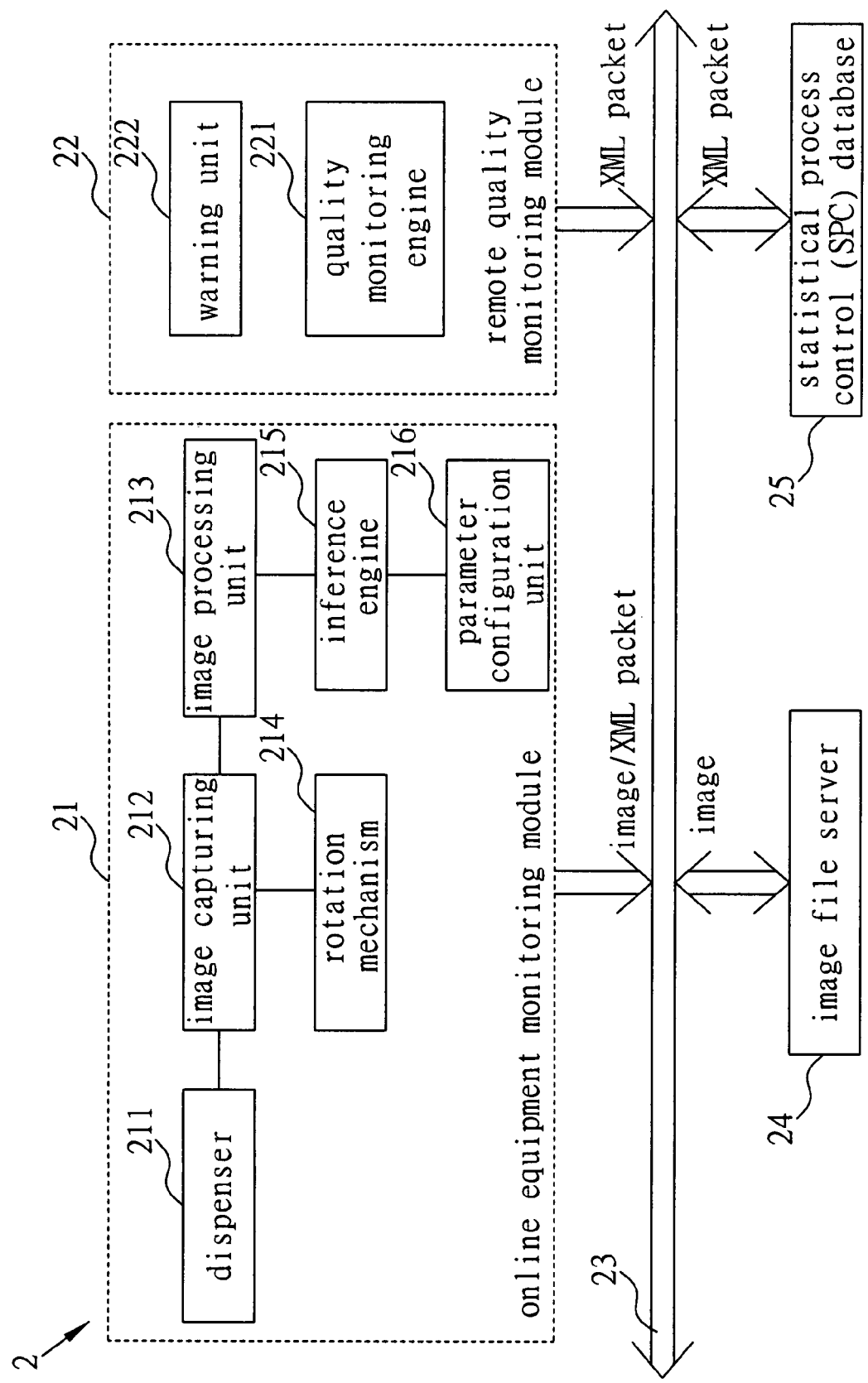
FIG. 1 is a block diagram showing the functions of a real-time dispenser fault detection and classification system corresponding to a real-time dispenser fault detection and classification method of a preferred embodiment in accordance with the present invention.

Referring to FIG. 1, which is a block diagram showing the functions of a real-time dispenser fault detection and classification system 2 corresponding to a real-time dispenser fault detection and classification method 1 of a preferred embodiment in accordance with the present invention, the system 2 comprises an online equipment monitoring module 21, a remote quality monitoring module 22, an image file server 24, a statistical process control (SPC) database 25, and a network 23 for connecting the online equipment monitoring module 21, remote quality monitoring module 22, image file server 24 and SPC database 25.

The online equipment monitoring module 21 comprises a dispenser 211, an image capturing unit 212, an image processing unit 213, a rotation mechanism 214, an inference engine 215, and a parameter configuration unit 216. The dispenser 211 dispenses adhesive on a substrate, such as a circuit board, along a first actuation axis and a second actuation axis perpendicular to the first actuation axis, so as to form on the circuit board a plurality of first adhesive dots along the first actuation axis and a plurality of second adhesive dots along the second actuation axis. The image capturing unit 212 captures-images formed on the circuit board by the first and second adhesive dots (including first images formed on the circuit board by the first adhesive dots and second images formed on the circuit board by the second adhesive dots). Specifically speaking, the image capturing unit 212 captures every single image formed on the circuit board by each of the adhesive dots as soon as the adhesive dot is formed on the circuit board. In other words, the image capturing unit 212 captures, dot by dot, every single image formed on the circuit board by each of the adhesive dots, so as to form the images. The image processing unit 213 is coupled to the image capturing unit 212 and adapted to process the images and obtain topology data of the images. For instance, the image processing unit 213 processes the images in terms of enhancement, segmentation, edge detection, and noise elimination. The rotation mechanism 214 rotatably secures in position the image capturing unit 212 to the dispenser 211. To be specific, where the dispenser 211 dispenses the adhesive on the circuit board along the first actuation axis, the image capturing unit 212 is rotated by the rotation mechanism 214 to such an extent as to face a first direction extending from the first actuation axis and thereby be able to capture the first images. Similarly, where the dispenser 211 dispenses the adhesive on the circuit board along the second actuation axis, the image capturing unit 212 is rotated by the rotation mechanism 214 to such an extent as to face a second direction extending from the second actuation axis and thereby be able to capture the second images.

The preferred embodiment of the present invention discloses the following. The image capturing unit 212 is a charge coupled device (CCD). The first and second actuation axes along which the dispenser 211 dispenses the first and second adhesive dots are perpendicular to each other. A first adhesive jet is formed by the first adhesive dots and a second adhesive jet by the second adhesive dots. The width and length of the first adhesive jet are different from or the same as that of the second adhesive jet. The online equipment monitoring module 21 has one and only one image capturing unit (that is, the image capturing unit 212). However, another embodiment of the present invention discloses the following. The first actuation axis and the second actuation axis cross at whatever angle, for example, 30° and 45°. The online equipment monitoring module 21 selectively comprises a plurality of image capturing units, depending on the number of the actuation axes along which the dispenser 211 dispenses the adhesive; for instance, where the dispenser 211 dispenses the adhesive on the circuit board along two actuation axes (that is, the first and second actuation axes), the online equipment monitoring module 21 may comprise two image capturing units adjustably facing the first and second directions so as to capture the first and second images. Inasmuch as the two image capturing units can capture the first and second images, no additional rotation mechanism 214 needs to be installed in the online equipment monitoring module 21 comprising the two image capturing units. In addition, as disclosed in the preferred embodiment of the present invention, the image capturing unit 212 further comprises an imaging judgment mechanism (not shown) for controlling the timing of commencement and termination of the capturing of the images by the image capturing unit 212.

Disposed on the circuit board are a commencement symbol and a termination symbol provided for the adhesive jets traveling along the axes, to prevent the image capturing unit 212 from capturing any useless images which may otherwise contribute to wrong judgment. The image capturing unit 212 will not start capturing the images of the adhesive dots unless and until the image capturing unit 212 captures the commencement symbol coatedly disposed on the circuit board and will not stop capturing the images of the adhesive dots unless and until the image capturing unit 212 captures the termination symbol coatedly disposed on the circuit board. Alternatively, where no commencement and termination symbols are disposed on the circuit board, the image capturing unit 212 does not start capturing the images of the adhesive dots until after the dispenser 211 has worked on the circuit board for a predetermined period of time (depending on the speed at which the dispenser 211 travels across the circuit board) or until after the dispenser 211 has traveled across the circuit board for a predetermined distance.

The inference engine 215 is coupled to the image processing unit 213 and configured to function as a predetermined comparison rule for comparing the topology data of the images with the predetermined topology data so as to allow the data about an operation condition of the dispenser 211 to be created. The parameter configuration unit 216 configures a parameter of the inference engine 215 and the image processing unit 213.

The preferred embodiment of the present invention further discloses the following. The topology data comprise an average of widths of the adhesive dots, a variance of the widths of the adhesive dots, an average of absolute width differences (target width minus actual width) of the adhesive dots, and an variance of the absolute width differences. The inference engine 215 is a support vector machine (SVM) comprising a plurality of predetermined conclusions. The predetermined conclusions respectively indicate three operation conditions comprising: an operation condition featuring a well-functioning nozzle of the dispenser 211 (hereinafter referred to as "well-functioning"); an operation condition featuring a displaced nozzle of the dispenser 211 (hereinafter referred to as "displaced"); and an operation condition featuring a jammed nozzle of the dispenser 211 (hereinafter referred to as "jammed"). The image file server 24 receives the images sent by the online equipment monitoring module 21 via the network 23, to partner with the online equipment monitoring module 21 in storage of the images. The SPC database 25 stores the topology data sent by the online equipment monitoring module 21 through the network 23, wherein the topology data are stored in the form of extensible markup language (XML) packets in the SPC database 25 by guaranteed message delivery (GMD).

The remote quality monitoring module 22 comprises a quality monitoring engine 221 and a warning unit 222. With a Shewhart control chart, the quality monitoring engine 221 controls the quality of the adhesive jets generated by the dispenser 211. For instance, both average absolute values of width difference (|target width minus actual width|) and average absolute values of skewness of the adhesive jets are controlled by an $\overline{X}$ control chart. For instance, both variance of absolute values of width difference (|target width minus actual width|) and variance of absolute values of skewness of the adhesive jets are controlled by an S or R control chart. The warning unit 222 outputs an abnormality warning in light of the operation condition of the dispenser 211. For example, in the event of the "displaced" or "jammed" operation condition of the dispenser 211, the quality monitoring engine 221 will instruct the warning unit 222 to beep or send email so as to notify an equipment engineer of the "displaced" or "jammed" operation condition of the dispenser 211. In the event of the "well-functioning" operation condition of the dispenser 211, the quality monitoring engine 221 will predict an upcoming operation condition of the dispenser 211 in accordance with a user-configured control rule; for example, in the event of a rising trend of abnormality spanning five consecutive adhesive dots, maintenance will be timely carried out with a view to reducing product non-conforming rate before the "well-functioning" operation condition of the dispenser 211 ceases. Last but not least, the remote quality monitoring module 22 is a basis for judging whether the online equipment monitoring module 21 is functioning well. Upon discovery of abnormality of the online equipment monitoring module 21, the inference engine 215 is trained anew.

Figure 2:
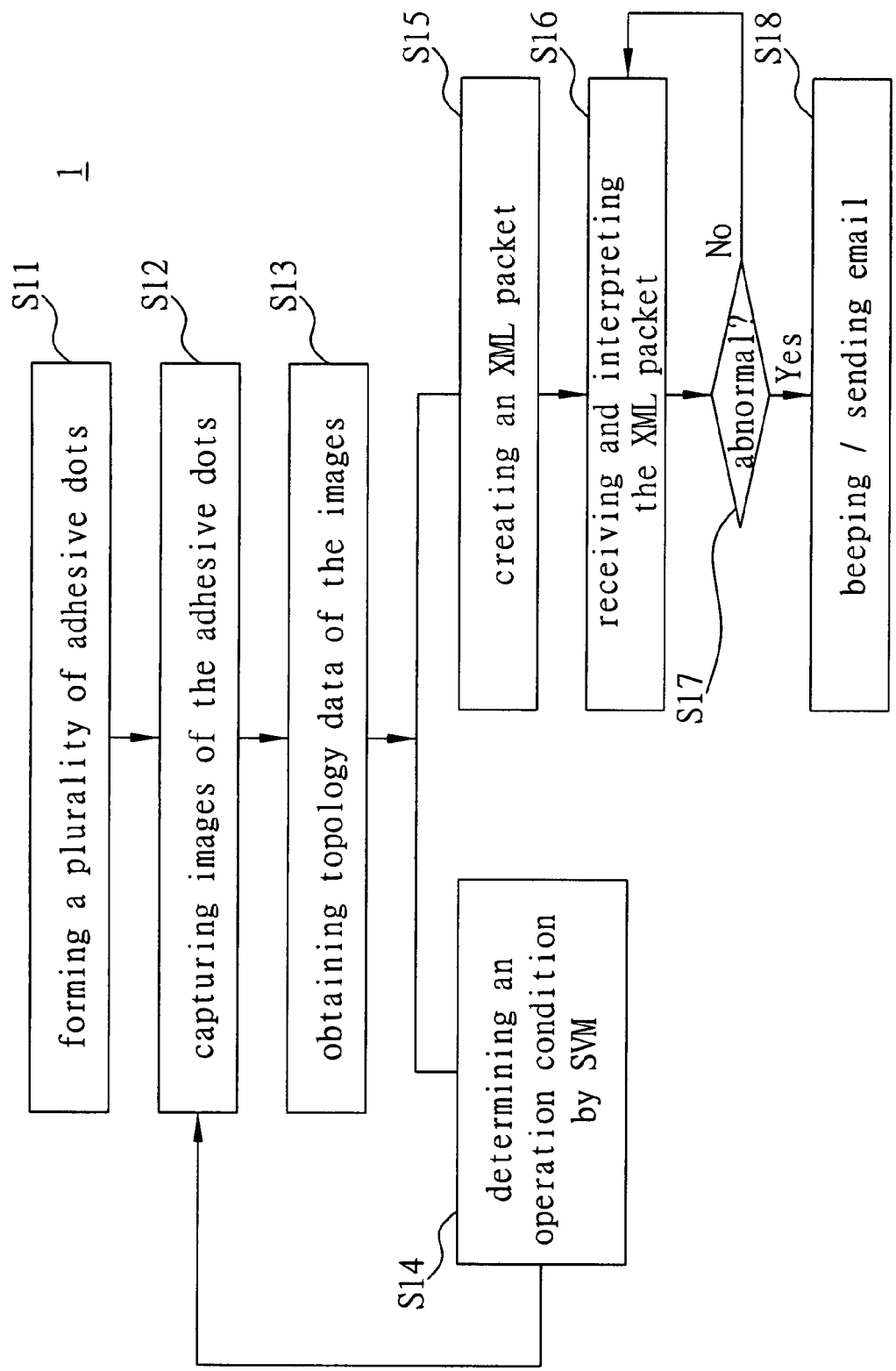
FIG. 2 is a flow chart of the real-time dispenser fault detection and classification method.

Referring to FIG. 2, which is a flow chart of the real-time dispenser fault detection and classification method 1, the method 1 starts with step S11. Step S11 comprises dispensing, by the dispenser 211, the adhesive on the circuit board and forming adhesive dots on the circuit board. Then, the method 1 proceeds to step S12.

Step S12 comprises capturing, by the image capturing unit 212, images of the adhesive dots as soon as the adhesive dots are formed on the circuit board. Then, the method 1 proceeds to step S13.

Step S13 comprises obtaining, by the image processing unit 213, topology data of the images. Then, the method 1 proceeds to steps S14 and S15.

Step S14 comprises determining, by the support vector machine 215, the operation condition of the dispenser 211 in accordance with the topology data of the images. A point to note is that step S14 of the method 1 is followed by step S12 of the method 1; in other words, the method 1 of the present invention comprises capturing, dot by dot, every single image formed on the circuit board by each of the adhesive dots as soon as the adhesive dot is formed on the circuit board, and determining, after the images formed by a predetermined number of adhesive dots have been captured, the operation condition of the dispenser 211 in accordance with the images captured. Accordingly, the dispenser 211 is monitored and diagnosed in a real-time manner.

Step S15 comprises creating extensible markup language (XML) packets and sending the created extensible markup language (XML) packets to the remote quality monitoring module 22 via the network 23. Then, the method 1 proceeds to step S16.

Step S16 comprises receiving and interpreting, by the quality monitoring engine 221 of the remote quality monitoring module 22, the extensible markup language (XML) packets. Then, the method 1 proceeds to step S17.

Step S17 comprises determining, by the quality monitoring engine 221, whether the dispenser 211 has an abnormality in light of the adhesive jet source data in the interpreted extensible markup language (XML) packets and by means of Shewhart control chart technology. In response to an affirmative determination, the method 1 proceeds to step S18; otherwise, the method 1 goes back to step S16.

Step S18 comprises instructing, by the quality monitoring engine 221, the warning unit 222 to beep or send email so as to notify the equipment engineer of the abnormality in a real-time manner.

Unlike the prior art, the present invention discloses a real-time dispenser fault detection and classification method, and the method comprises capturing images formed by adhesive dots as soon as the adhesive dots are formed on a circuit board by a dispenser 211 dispensing adhesive on the circuit board and then determining the operation condition of the dispenser 211. Accordingly, an equipment engineer is notified, in a real-time manner, of whether the dispenser 211 has abnormality and what kind of abnormality the dispenser 211 has. In addition, the present invention is cheaper and more feasible than the prior art, because the present invention discloses a real-time dispenser fault detection and classification method that comprises the step of determining whether the dispenser 211 has abnormality by means of an inference engine 215 as opposed to the naked eye.

The aforesaid embodiment merely serves as the preferred embodiment of the present invention. The aforesaid embodiment should not be construed as to limit the scope of the present invention in any way. Hence, any other changes can actually be made in the present invention. It will be apparent to those skilled in the art that all equivalent modifications or changes made to the present invention, without departing from the spirit and the technical concepts disclosed by the present invention, should fall within the scope of the appended claims.

What is claimed is:

1. A real-time dispenser fault detection and classification method for monitoring adhesive dots dispensed on a substrate by a dispenser, the method comprising the steps of:
    dispensing, by the dispenser, adhesive on the substrate so as to form a plurality of adhesive dots on the substrate;
    capturing images formed on the substrate with the adhesive dots as soon as the adhesive dots are formed on the substrate;
    capturing a commencement symbol and a termination symbol coatedly disposed on the substrate, wherein capturing of the images formed on the substrate with the adhesive dots will not start unless and until the commencement symbol is captured and will not stop unless and until the termination symbol is captured; and
    comparing topology data of the images with predetermined topology data in accordance with a predetermined comparison rule so as to create data about an operation condition of the dispenser.

2. The method of claim 1, wherein the predetermined comparison rule is an inference engine comprising a plurality of predetermined conclusions, and the operation condition is one selected from the predetermined conclusions.

3. The method of claim 2, wherein the inference engine is a support vector machine (SVM), the dispenser comprises a nozzle for dispensing the adhesive, and the predetermined conclusions comprise an operation condition featuring a well-functioning dispenser nozzle, an operation condition featuring a displaced dispenser nozzle, and an operation condition featuring a jammed dispenser nozzle.

4. The method of claim 3, further comprising configuring a parameter of the support vector machine (SVM).

5. The method of claim 2, further comprising appending the topology data of the images to the predetermined topology data and appending a conclusion corresponding to the operation condition to the predetermined conclusions if none of the topology data matches the predetermined topology data in accordance with the predetermined comparison rule.

6. The method of claim 1, wherein the topology data comprise an average of widths of the adhesive dots, an variance of the widths of the adhesive dots, an average of absolute width differences (target width minus actual width) of the adhesive dots, and an variance of the absolute width differences .

7. The method of claim 1, further comprising sending the images to an image file server via a network.

8. The method of claim 1, further comprising storing the topology data in a statistical process control (SPC) database via a network and controlling, by SPC technology, quality of adhesive jets produced by the dispenser.

9. The method of claim 8, wherein the topology data of the images are stored in the form of extensible markup language (XML) packets in the statistical process control (SPC) database via the network.

10. The method of claim 9, further comprising storing, by guaranteed message delivery (GMD), the extensible markup language (XML) packets in the statistical process control (SPC) database via the network.

11. The method of claim 1, further comprising outputting an abnormality warning in light of the operation condition.

12. The method of claim 1, further comprising capturing every single image formed on the substrate with each of the adhesive dots as soon as the adhesive dot is formed on the substrate.

13. The method of claim 12, further comprising, after the images formed on the substrate with a predetermined number of adhesive dots have been captured, the topology data of the captured images compared with the predetermined topology data in accordance with the predetermined comparison rule so as to create the data about the operation condition of the dispenser.

14. The method of claim 1, further comprising dispensing, by the dispenser, the adhesive on the substrate along a first actuation axis and a second actuation axis not parallel to the first actuation axis and forming on the substrate a plurality of first adhesive dots along the first actuation axis and a plurality of second adhesive dots along the second actuation axis.

15. The method of claim 14, wherein the first actuation axis is perpendicular to the second actuation axis.

16. The method of claim 14, wherein a first adhesive jet formed by the first adhesive dots differs from a second adhesive jet formed by the second adhesive dots in length and width.

17. The method of claim 14, further comprising capturing, by a single image capturing unit, first images of the first adhesive dots and second images of the second adhesive dots on the substrate, wherein the single image capturing unit faces a first direction extending from the first actuation axis so as to capture the first images whenever the dispenser dispenses the adhesive on the substrate along the first actuation axis, and the single image capturing unit rotates to face a second direction extending from the second actuation axis so as to capture the second images whenever the dispenser dispenses the adhesive on the substrate along the second actuation axis.

18. The method of claim 17, wherein the single image capturing unit is a charge coupled device (CCD).

19. The method of claim 14, wherein first images of the first adhesive dots dispensed on the substrate and second images of the second adhesive dots dispensed on the substrate are captured by two image capturing units respectively.

20. The method of claim 19, wherein the image capturing unit further comprises an imaging judgment mechanism for controlling timing of commencement and termination of capturing of the images by the image capturing unit.

* * * * *